United States Patent [19]

Taniguchi

[11] Patent Number: 4,727,285

[45] Date of Patent: Feb. 23, 1988

[54] DISPLAY DEVICE AND PRINTED CIRCUIT BOARD

[75] Inventor: Koki Taniguchi, Osaka, Japan

[73] Assignee: Sharp Kabushiki Kaisha, Osaka, Japan

[21] Appl. No.: 751,889

[22] Filed: Jul. 5, 1985

[30] Foreign Application Priority Data

Jul. 6, 1984 [JP] Japan ............................ 59-103036[U]

[51] Int. Cl.⁴ .............................. H01J 5/50; G02F 1/13
[52] U.S. Cl. ..................................... 313/512; 313/510; 313/51; 350/330
[58] Field of Search ........................ 313/51, 512, 510; 350/330

[56] References Cited

U.S. PATENT DOCUMENTS 4,508,990  4/1985  Essinger .......................... 313/51 X

*Primary Examiner*—Palmer C. DeMeo
*Attorney, Agent, or Firm*—Birch, Stewart, Kolasch & Birch

[57] ABSTRACT

A PC board consisting of a conductive layer laid through an insulating layer on a metal plate surface is easily bendable to make any desirable shape. This permits any desired distance to be provided between the display element and the PC board. In addition, it is possible to form display element-fixing angles integrally with the PC board. As a result, the number of components required is decreased and production efficiency improved. Moreover, the metal plate of the PC board protects the display device from unnecessary radiation, external noises and/or static electricity.

10 Claims, 3 Drawing Figures

DISPLAY DEVICE AND PRINTED CIRCUIT BOARD

BACKGROUND OF THE INVENTION

The present invention relates to a display device used in a digital display.

Conventionally, anisotropic electric conductive rubber connectors are used in wiring digital display units, but none of them are suitable for a digital display of high precision and of large capacity.

SUMMARY OF THE INVENTION

Accordingly, the object of the present invention is to provide a highly reliable and precise display device of a large capacity and with added value increased because back light illumination is easily installed between the display element and the PC (printed circuit) board.

Briefly described, the present invention of a display device comprises a display element and a PC board with a conductive layer mounted on an insulating layer on a metal plate, one lateral end portion or both lateral end portions of said PC board being bent upwardly and then outwardly to define a horizontal flat portion on which said display element is mounted.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 1 is a perspective view of the display device according to the present invention, FIG. 2 is a front view of the display device in FIG. 1, and FIG. 3 is a sectional view showing a PC board.

DESCRIPTION OF THE PREFERRED EMBODIMENT

Figure 1:
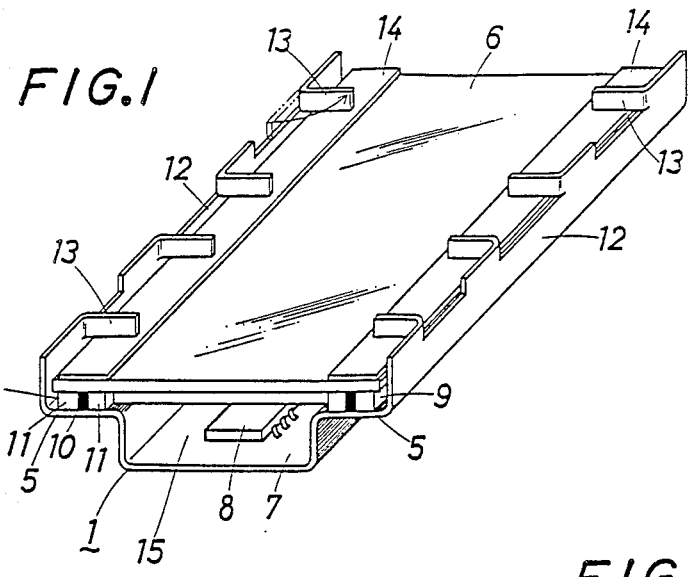
FIGS. 1 through 3 show an embodiment of the present invention.
Figure 3:
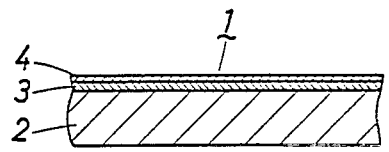
Figure 2:
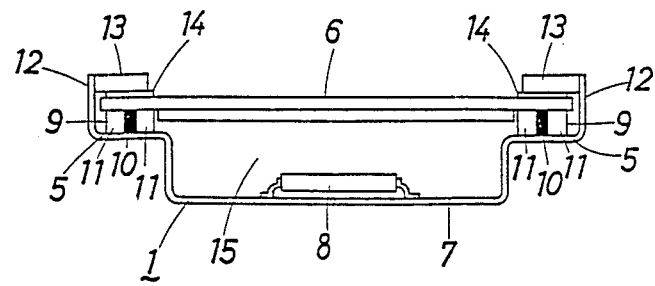

An embodiment of the present invention will be described below with reference to FIGS. 1 through 3.

A PC board 1 comprises a conductive layer 4 mounted through an insulating layer 3 on a metal plate 2. The metal plate 2 may be made of aluminum, iron or copper. The aluminum plate is easily bent. The insulating layer 3 may be made of, for example, glass epoxy. When the glass epoxy in two layers is used for the insulating layer 3, withstanding of high and stable voltage is obtained and pin holes are minimized even if the insulating layer 3 is thin. The conductive layer 4 may be formed by applying a copper sheet on the insulating layer 3.

The lateral two end portions of the thus constructed PC board 1 are bent upwardly and outwardly to define horizontal flat portions 5, 5. The distance between these horizontal flat portions 5, 5 approximately coincides with the width of a display element 6. The height of the horizontal flat portions 5, 5 from the bottom 7 of the PC board 1 is discretionally determined. Anisotropic electric conductive rubber connectors 9, 9 are respectively mounted on the horizontal flat portions 5, 5, and the display element 6 is placed on the anisotropic electric conductive rubber connectors 9, 9. The anisotropic electric conductive rubber connector 9 comprises an anisotropic electric conductive rubber 10 consisting of alternate conductive rubbers and insulating rubbers, and insulating rubbers 11, 11 applied to the respective sides of the anisotropic electric conductive rubber 10. The pitch of the anisotropic electric conductive rubbers 10 conforms to that of the connection terminals (not shown) of the display element 6.

The display element 6 may be, for example, a liquid crystal display element. An electroluminescent display element may be used if the anisotropic electric conductive rubber connector 9 is made of metallic fibers or powders. The outer ends of the horizontal flat portions 5, 5 are further bent upwardly to form raised portions 12, 12, several parts of which are cut and raised to define fixing members 13 to fix the display element 6. Set panels 14, 14 may be placed between the display element 6 and the fixing members 13. The fixing means for the display element 6 need not be limited to the above described fixing members.

Driving circuit elements 8, . . . are mounted on the bottom 7 of the PC board 1 to drive the display element 6. Back light illumination may be provided in the space 15 defined between the bottom 7 and the display element 6.

Only one lateral end portion of the PC board 1 may be bent to form a horizontal flat portion, instead of bending two lateral end portions as described above.

While only certain embodiments of the present invention have been described, it will be apparent to those skilled in the art that various changes and modifications may be made therein without departing from the spirit and scope of the present invention as claimed.

What is claimed is:

1. A display device comprising:
   a printed circuit board with a conductive layer mounted on an insulating layer, said insulating layer being mounted on a metal plate surface, said printed circuit board having a lateral end bent upwardly to form a first horizontal portion located at one elevation, a vertical portion, and a second horizontal portion located at a different elevation than said first horizontal portion;
   a display element extending above said second horizontal portion of said printed circuit board, said display element having an end mounted on said first horizontal portion; and
   a space defined by opposed surfaces of the display element and said second horizontal portion of said printed circuit board, said space permitting back light illumination for said display element.

2. A display device according to claim 1, comprising driving circuit elements for driving said display element, said driving circuit elements being mounted on said printed circuit board.

3. A display device according to claim 2, wherein said driving circuit elements are mounted on said second horizontal portion of said printed circuit board.

4. A display device according to claim 1, wherein said insulating layer of said printed circuit board is made of glass epoxy.

5. A display device according to claim 1, wherein said display element is a liquid crystal display element.

6. A display device comprising:
a printed circuit board with a conductive layer mounted on an insulating layer, said insulating layer being mounted on a metal plate surface, said printed circuit board having a first lateral end bent upwardly to form a first horizontal portion located at one elevation, a vertical portion, and a second horizontal portion located at a different elevation than said first horizontal portion, said printed circuit board having a second lateral end portion bent upwardly to form a second vertical portion and a third horizontal portion located at approximately the same elevation as the first horizontal portion of said printed circuit board;
a display element extending above the second horizontal portion of said printed circuit board, said display element having a first and second end mounted respectively on said first and third horizontal portions of said printed circuit board; and
a space defined by opposed surfaces of the display element and said second horizontal portion of said printed circuit board, said space permitting back light illumination for said display element.

7. A display device according to claim 6, comprising driving circuit elements for driving said display element, said driving circuit elements being mounted on said printed circuit board.

8. A display device according to claim 7, wherein said driving circuit elements are mounted on said second horizontal portion of said printed circuit board.

9. A display device according to claim 6, wherein said insulating layer of said printed circuit board is made of glass epoxy.

10. A display device according to claim 6, wherein said display element is a liquid crystal display element.

* * * * *